United States Patent [19]
Saeki et al.

[11] Patent Number: 5,796,281
[45] Date of Patent: Aug. 18, 1998

[54] INPUT BUFFER CIRCUIT WITH HYSTERESIS FOR NOISE CONTROL

[75] Inventors: Takanori Saeki; Yukio Fukuzo, both of Tokyo, Japan

[73] Assignee: NEC Corporation, Tokyo, Japan

[21] Appl. No.: 681,358

[22] Filed: Jul. 23, 1996

[30] Foreign Application Priority Data

Jul. 25, 1995 [JP] Japan .................... 7-209240

[51] Int. Cl.$^6$ .................. H03K 3/297; H03K 19/094; H03K 17/16
[52] U.S. Cl. .................. 327/206; 327/53; 327/54; 327/391; 326/34; 323/316
[58] Field of Search .................. 327/206, 205, 327/379, 389, 391, 51, 52, 53, 54, 55, 56, 65, 66, 67, 73, 77, 72; 36/21, 31, 34; 330/85; 323/315, 316

[56] References Cited

U.S. PATENT DOCUMENTS

| | | | |
|---|---|---|---|
| 3,612,908 | 10/1971 | Heimbigner | 327/206 |
| 4,069,431 | 1/1978 | Kucharewski | 327/73 |
| 4,177,394 | 12/1979 | Takasugi | 327/74 |
| 4,438,349 | 3/1984 | Shoji | 327/85 |
| 4,563,594 | 1/1986 | Koyama | 327/206 |
| 4,786,825 | 11/1988 | O'Shaughnessy et al. | 327/206 |
| 4,874,969 | 10/1989 | Meadows | 327/206 |
| 5,349,246 | 9/1994 | McClure | 326/22 |
| 5,463,339 | 10/1995 | Riggio, Jr. | 327/206 |
| 5,528,185 | 6/1996 | Lewicki et al. | 327/206 |
| 5,594,361 | 1/1997 | Campbell | 326/83 |
| 5,656,957 | 8/1997 | Marlow et al. | 327/67 |

FOREIGN PATENT DOCUMENTS

5-335898  12/1993  Japan ............... H03K 3/027

OTHER PUBLICATIONS

Gunning, et al., "A CMOS Low Voltage–Swing Transmission–Line Transceiver", ISSCC Digest of Technical Papers, 1992, pp. 58–59.

Primary Examiner—Timothy P. Callahan
Assistant Examiner—Terry L. Englund
Attorney, Agent, or Firm—Whitham, Curtis & Whitham

[57] ABSTRACT

In an interface for an input signal with a small amplitude and a high bit rate, the output voltage of a receiver can become more indeterminate when the input signal voltage at the receiving end of a signal transmission line becomes equal to a reference voltage $V_{ref}$. In the input buffer circuit of the CMOS current mirror type, a transistor $Q_2$ is connected in parallel with another transistor $Q_1$, where the conductivity types of both the transistors are the same and a reference voltage $V_{ref}$ is applied to the gate electrode of the transistor $Q_1$. The transistor $Q_2$ endows the input buffer circuit with a hysteresis characteristic, and the output power N1 of the input buffer circuit is supplied to the gate electrode of the transistor $Q_2$.

7 Claims, 4 Drawing Sheets

INPUT BUFFER CIRCUIT WITH HYSTERESIS FOR NOISE CONTROL

FIELD OF THE INVENTION

The invention relates to an input buffer circuit, and especially to an input receiver with a hysteresis characteristic of an interface for an input signal with a small amplitude.

BACKGROUND OF THE INVENTION

The input buffer circuit with the hysteresis characteristic has been used in order to prevent a situation that the input buffer circuit turns on or off by not only the input signal but also a noise involved in the input signal, and thereby the input signal cannot exactly propagate. The input buffer circuit with the hysteresis characteristic has two threshold values, $V_{TH}$ and $V_{TL}$. $V_{TH}$ is the threshold value in case that the input signal rises up, and a $V_{TL}$ is the threshold value in case that the input signal falls down. Accordingly, if the input signal becomes larger than $V_{TH}$ and the input buffer circuit turns on, it never fall down, till the input voltage becomes smaller than $V_{TL}$. Then, the noise with a width of $V_{TH}$-$V_{TL}$ can be eliminated.

The buffer circuit with the hysteresis characteristic mentioned in the above has been used in the input circuits of various electronic devices, such as a semiconductor memory device, a micro electronic computer and etc., in order to suppress the influence of the noise, which causes troubles in case that the input signal rises up and falls down.

Hitherto, in the input buffer circuit with the hysteresis characteristic has a structure, which combines CMOS inverters, as shown in Japanese Patent Kokai 5-335898.

However, the amplitude of the input signal supplied to an interface becomes smaller in accordance with a recent tendency that the data processing speed of a system becomes higher. Such an input buffer circuit is proposed in a paper, "A CMOS Low Voltage-Swing Transmission-Line Transceiver", ISSCC Digest of Technical Papers, p.p.58 to 59 (1992).

The aforementioned input buffer circuit has the structure of the current mirror type. The circuit is supplied with a reference voltage, compares the input signal with the reference voltage and turns on or off.

On the aforementioned input buffer circuit of the current mirror type according to the conventional technology, a following disadvantage has been pointed out. When the input signal with a high output impedance becomes equal to the reference voltage Vref, even a small noise voltage is amplified by the input buffer circuit of the current mirror type, propagates through an electronic device and causes the increase of the electrical energy consumption.

SUMMARY OF THE INVENTION

Accordingly, it is an object of the invention to provide an input buffer circuit of a CMOS current mirror type, which is endowed with the hysteresis characteristic and operates with high stability, even when the level of the input signal with a high output impedance is nearly equal to the level of the reference voltage Vref.

It is the further object of the invention to provide an input buffer circuit of a CMOS of inverter type, which is endowed with the hysteresis characteristic and operates with high stability, even when the level of the input signal with a high output impedance is nearly equal to the level of the reference voltage Vref.

According to the first feature of the invention, an input buffer circuit of a CMOS current mirror type comprises:

a first transistor, which is supplied with a reference voltage;

a second transistor, which is connected in parallel with the first transistor and endows the input buffer circuit with a hysteresis characteristic;

wherein conductivity types of the first and second transistors are the same, and a gate electrode of the second transistor is supplied with an output voltage of the input buffer circuit.

According to the second feature of the invention, an input buffer circuit of a CMOS of inverter type comprises:

a first transistor, which is supplied with a reference voltage; and a second transistor, which is connected in parallel with the first transistor and endows the input buffer circuit with a hysteresis characteristic;

wherein conductivity types of the first and second transistors are the same, and a gate electrode of the second transistor is supplied with an output voltage of the input buffer circuit.

The principle of the invention can be summarized as follows. In the input buffer circuit of a CMOS current mirror or inverter type, two transistors with the same conductivity type are connected in parallel with each other. The gate electrode of one of them is supplied with the reference voltage Vref. Another one of them, the gate electrode of which is supplied with the output voltage of the input buffer circuit, endows the input buffer circuit with the hysteresis characteristic. Then, the indeterminacy of the output of a receiver can be avoided, in case that the input signal to the signal transmission line has a high output impedance.

BRIEF DESCRIPTION OF THE DRAWINGS

The invention will be explained in more detail in conjunction with the appended drawings, wherein.

DESCRIPTION OF THE PREFERRED EMBODIMENTS

Before explaining input buffer circuits in the preferred embodiments according to the invention, the aforementioned input buffer circuit according to the conventional technology will be explained.

Figure 1:
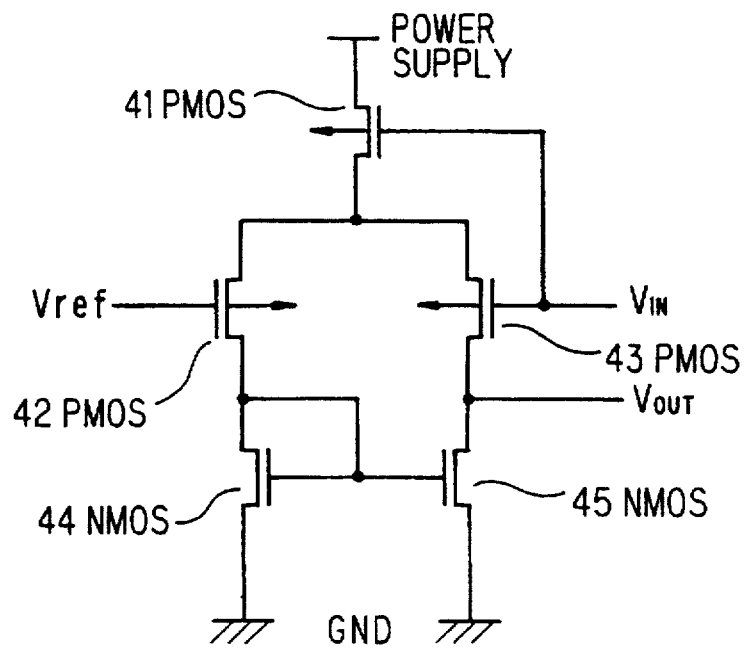
FIG. 1 shows the circuit diagram of a conventional input buffer circuit.

FIG. 1 shows a current mirror circuit according to a conventional technology. In FIG. 1, 41 is a PMOS, 42 is a PMOS, 43 is a PMOS, 44 is a NMOS and 45 is a NMOS.

The source electrode of the PMOS 41 is connected to a power supply, its gate electrode is connected to an input terminal for Vin and its drain electrode is connected to the source electrodes of the PMOSes 42 and 43.

Moreover, the gate electrode of the PMOS 42 is connected to the input terminal of a reference voltage Vref, its source electrode is connected to the drain electrode of the PMOS 41, and its drain electrode is connected to the drain and gate electrodes of the NMOS 44 and the gate electrode of the NMOS 45.

The gate electrode of the PMOS 43 is connected to the input terminal of Vin, its source electrode is connected to the drain electrode of the PMOS 41, and its drain electrode is connected to the drain electrode of the NMOS 45 and the terminal of the output voltage Vout.

Moreover, the gate electrode of the NMOS 44 is connected to the drain electrode of PMOS 42 and the gate electrode of the NMOS 45, its source electrode is connected to the ground terminal GND, and its drain electrode is connected to the gate electrode of the NMOS 44 and the drain electrode of the PMOS 42.

Furthermore, the gate electrode of the NMOS 45 is connected to the gate electrode of the NMOS 44 and the drain electrode of the PMOS 42, its source electrode is connected to the ground terminal GND, and its drain electrode is connected to the drain electrode of the PMOS 43.

The input buffer circuit shown in FIG. 1, which is provided with a circuit of a current mirror type, compares the input signal voltage with the reference voltage and turns on or off.

The input buffer circuit, which is provided with a current mirror circuit for a small signal voltage, is not endowed with the hysteresis characteristic in order to decrease the noise level, in view of the recent tendency that the amplitude of the input signal becomes smaller.

Next, preferred embodiments of the invention will be explained referring to the appended drawings.

Figure 2:
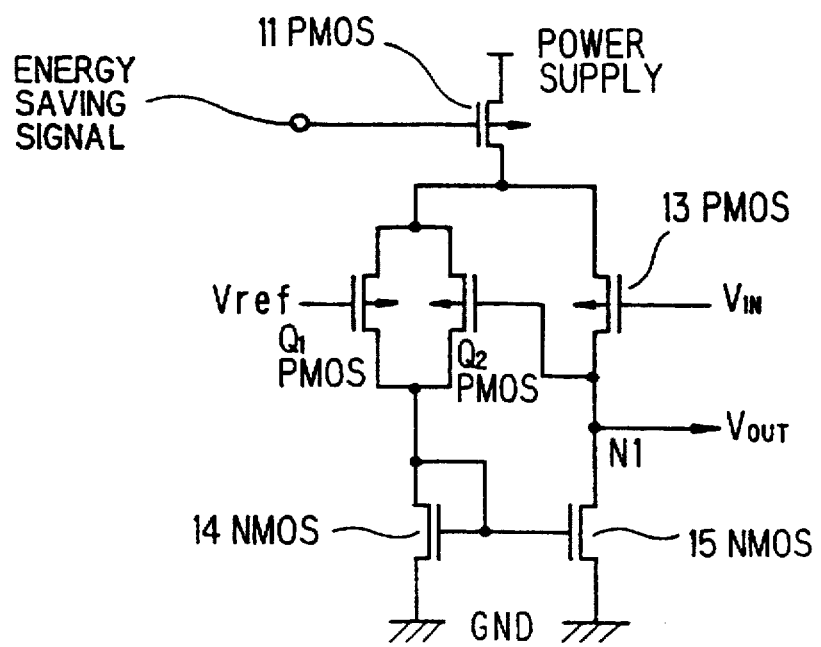
FIG. 2 shows the circuit diagram of the first preferred embodiment of the invention.

FIG. 2 shows the circuit diagram of an input buffer circuit according to the invention, which is used in a interface for a small amplitude signal.

In FIG. 2, 11 is a PMOS, 13 is a PMOS, 14 is a NMOS and 15 is a NMOS.

The source electrode of the PMOS 11 is connected to a power supply, its gate electrode is supplied with a energy saving signal, its drain electrode is connected to the source electrodes of PMOS transistors $Q_1$ and $Q_2$, which are connected in parallel with each other, and to the source electrode of the PMOS 13.

The gate electrode of the PMOS transistor $Q_1$ is supplied with a reference voltage Vref, and the gate electrode of the PMOS transistor $Q_2$, is connected to the drain electrode of the PMOS 13, and the source electrodes of these PMOS transistors, $Q_1$ and $Q_2$, are connected to the drain electrode of the PMOS 11, and the drain electrodes of them are connected to the drain and gate electrodes of the NMOS 14.

The gate electrode of the PMOS 13 is supplied with Vin, and its source electrode is connected to the drain electrode of the PMOS 11, and its drain electrode is connected to the drain electrode of the NMOS 15 and the gate electrode of the PMOS $Q_2$.

The gate electrode of the NMOS 14 is connected to the drain electrode of the NMOS 14 and the gate electrode of the NMOS 15, and its source electrode is connected to a ground terminal GND, its drain electrode is connected to the drain electrodes of the PMOSes, $Q_1$ and $Q_2$, and to the gate electrode of the NMOS 14.

Moreover, the gate electrode of the NMOS 15 is connected to the gate electrode of the NMOS 14, and its source electrode is connected to the ground terminal GND, and its drain electrode is connected to the drain electrode of the PMOS 13.

As mentioned in the above, in the input buffer circuit of the current mirror type, having an input portion composed of the PMOS transistors, the PMOS transistor $Q_1$, which is supplied with the reference voltage, and another PMOS transistor $Q_2$, the gate electrode of which is connected to the current mirror output node N1, are connected in parallel with each other.

Figure 3:
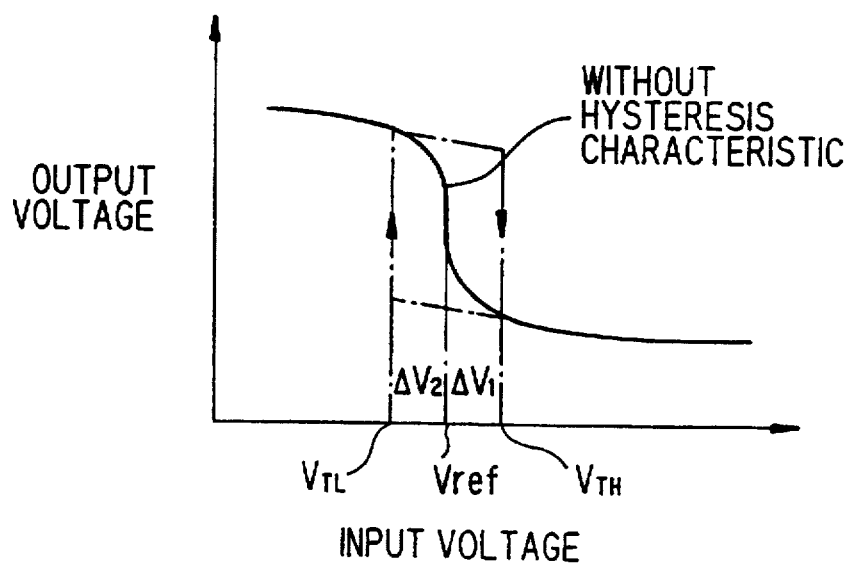
FIG. 3 shows the input-output characteristic of the first preferred embodiment of the invention.

FIG. 3 shows the output voltage of the aforementioned first preferred embodiment of the invention as the function of an input voltage.

In FIG. 3, the axis of abscissas shows the input voltage, and that of ordinates the output voltage.

If the PMOS transistor $Q_2$ is not connected, the level of the output voltage Vout is suddenly changed, when the input voltage Vin passes the reference voltage Vref in both cases that Vin rises up and falls down.

When the PMOS transistor $Q_2$ is connected, the level of the input voltage Vin, at which the level of the output voltage Vout is suddenly changed, is Vref+$\Delta V_1$ when the input voltage Vin rises up, and is Vref-$\Delta V_2$ when Vin falls down. The values of $\Delta V_1$ and $\Delta V_2$ depend on the current drive ability of the PMOS transistor $Q_2$.

When the PMOS transistor $Q_2$ has a large current drive ability, the values of $\Delta V_1$ and $\Delta V_2$ can be large. The values of $\Delta V_1$ and $\Delta V_2$ can be adjusted in accordance with the rated value of the input voltage of the transistor. $\Delta V_1$ is so set that it is about 50% value of the difference between the high rated voltage of the input signal and the reference voltage Vref. On the other hand, $\Delta V_2$ is so set that it is about 50% value of the difference between the reference voltage Vref and the low rated voltage of the input signal.

According to the aforementioned setting, even when the transistor is so rated that its input impedance is high in case that an input voltage is equal to Vref, the output level is unchanged and thereby unnecessary consumption of electrical energy can be decreased, if the variation of the state, in which the input impedance is high, is limited within a region $-\Delta V_2$ to $\Delta V_1$.

Figure 4:
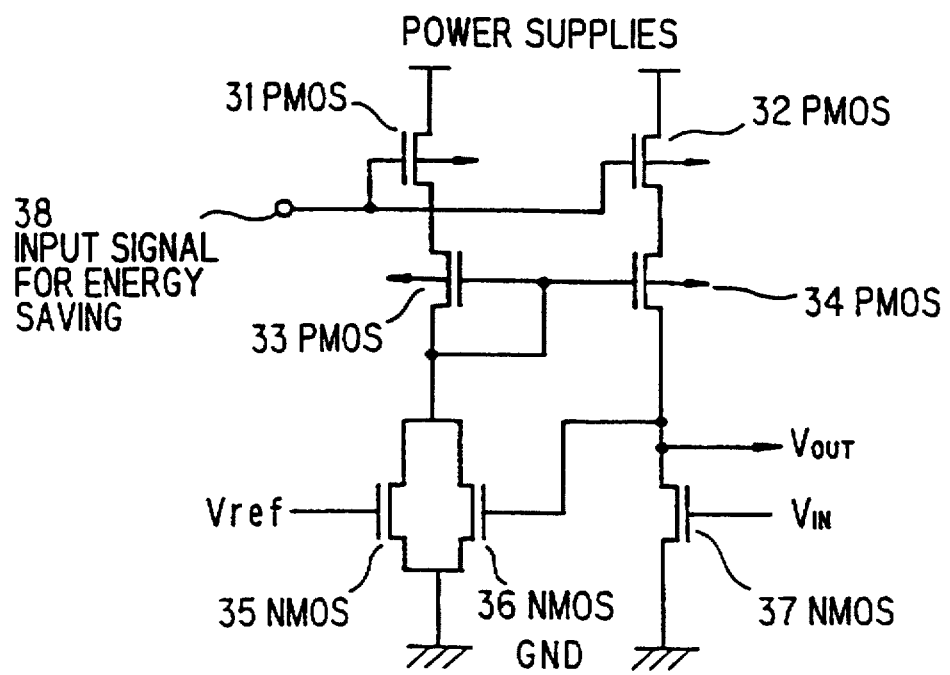
FIG. 4 shows the circuit diagram of the second preferred embodiment of the invention.

FIG. 4 shows the circuit diagram of the second preferred embodiment of the invention. 31, 32, 33 and 34 are PMOSes, and 35, 36 and 37 are NMOSes. The source electrodes of the PMOSes 31 and 32 are respectively connected to power supplies, and the gate electrodes of them are supplied with an input signal 38 for energy saving. The drain electrode of the PMOS 31 is connected to the source electrode of the PMOS 33. The drain electrode of the PMOS 33 is connected to the drain electrodes of the NMOSes 35 and 36. The source electrodes of the NMOSes 35 and 36 are connected to the GND. The drain electrode of the PMOS 32 is connected to the source electrode of the PMOS 34. The drain electrode of the PMOS 34 is connected to the drain electrode of the NMOS 37. The source electrode of the NMOS 37 is connected to the GND. The gate electrodes of the PMOSes 33 and 34 are connected to the drain electrodes of the NMOSes 35 and 36. The gate electrode of the NMOS 35 is supplied with the reference voltage Vref. The gate electrode of the NMOS 36 is connected to the drain electrodes of the PMOS 34 and the NMOS 37, where Vout is sent off from the drain electrode 37. The gate electrode of the NMOS 37 is supplied with Vin.

In the explanation of the first preferred embodiment, the circuit of the PMOS current mirror type is described. However, a similar result can be obtained in a circuit of the NMOS current mirror type, and the input buffer circuit of an inverter type shown in FIG. 4 is described as the second preferred embodiment of the invention.

The circuit shown as the second preferred embodiment is effective, when the level of $V_{ref}$ is nearly equal to the threshold voltage of the transistor.

As described in the above, since the input buffer circuit for a small input signal voltage is endowed with the hysteresis characteristic, the input buffer circuit dose not turn on or off by noise voltages, even when the input signal with a high output impedance is equal to the reference voltage, and thereby unnecessary consumption of electrical energy can be suppressed.

Although the invention has been described with respect to specific embodiments for complete and clear disclosure, the appended claims are not to be thus limited but are to be construed as embodying all modifications and alternative constructions that may be occurred to one skilled in the art which fairly fall within the basic teaching here as set forth.

What is claimed is:

1. A complementary metal oxide semiconductor (CMOS) current mirror input buffer circuit, comprising:

a first transistor supplied with a reference voltage;

a second transistor connected in parallel with said first transistor, said second transistor having a gate connected to a current mirror output node of said input buffer circuit for endowing said input buffer circuit with a hysteresis characteristic, wherein conductivity types of said first and second transistors are the same.

2. An input buffer circuit, comprising:

input and output terminals;

first and second power supplies;

a first p-type metal oxide semiconductor (PMOS) transistor having a source to drain path connected between said first power supply and a first nodal point and said first PMOS transistor having a gate supplied with an energy saving signal;

second and third PMOS transistors connected in parallel to each other and having source to drain paths connected between said first nodal point and a second nodal point, said second PMOS transistor having a gate supplied with a reference voltage, and said third PMOS transistor having a gate connected to said output terminal;

a fourth PMOS transistor having a source to drain path connected between said first nodal point and said output terminal, and having a gate connected to said input terminal;

a first n-type metal oxide semiconductor (NMOS) transistor having a source to drain path connected between said second nodal point and said second power supply, and having a gate connected to said second nodal point; and a second NMOS transistor having a source to drain path connected between said output terminal and said second power supply, and having a gate connected to said second nodal point with said gate of said first NMOS transistor.

3. An input buffer circuit as recited in claim 2 wherein said second power supply is ground.

4. An input buffer circuit, comprising:

first and second p-type metal oxide semiconductor (PMOS) transistors connected in series to have serially connected source to drain paths between a first power supply and a first nodal point, a gate of said first PMOS transistor being supplied with an energy saving signal, and a gate of said second PMOS transistor being connected to said first nodal point;

third and fourth PMOS transistors connected in series to have serially connected source to drain paths between said first power supply and an output terminal, a gate of said third PMOS transistor being supplied with said energy saving signal with said gate of said first PMOS transistor, and a gate of said fourth PMOS transistor being connected to said first nodal point with said gate of said second PMOS transistor;

first and second n-type metal oxide semiconductor (NMOS) transistors connected in parallel to have source to drain paths between said first nodal point and a second power supply, a gate of said first NMOS transistor being supplied with a reference voltage, and a gate of said second NMOS transistor being connected to said output terminal; and a third NMOS transistor having a source to drain path connected between said output terminal and said second power supply, and a gate of said third NMOS transistor being supplied with an input terminal.

5. An input buffer circuit as recited in claim 4 wherein said second power supply is ground.

6. An input buffer circuit, comprising:

input and output terminals;

a first p-type metal oxide semiconductor (PMOS) transistor connected between a power supply and a first nodal point and having a gate for receiving an energy saving signal;

second and third PMOS transistors connected in parallel to each other between said first nodal point and a second nodal point, said second PMOS transistor having a gate for receiving a reference voltage, and said third PMOS transistor having a gate connected to said output terminal;

a fourth PMOS transistor connected between said first nodal point and said output terminal, and having a gate connected to said input terminal;

a first n-type metal oxide semiconductor (NMOS) transistor connected between said second nodal point and ground, and having a gate connected to said second nodal point; and a second NMOS transistor connected between said output terminal and ground, and having a gate connected to said gate of said first NMOS transistor.

7. An input buffer circuit, comprising:

first and second p-type metal oxide semiconductor (PMOS) transistors serially connected between a power supply and a first nodal point, agate of said first PMOS transistor for receiving an energy saving signal, and a gate of said second PMOS transistor being connected to said first nodal point;

third and fourth PMOS transistors connected in series between the power supply and an output terminal, a gate of said third PMOS transistor for receiving said energy saving signal, and a gate of said fourth PMOS transistor being connected to said first nodal point;

first and second n-type metal oxide semiconductor (NMOS) transistors connected in parallel between said first nodal point and ground, a gate of said first NMOS transistor for receiving a reference voltage, and a gate of said second NMOS transistor being connected to said output terminal; and a third NMOS transistor connected between said output terminal and ground, and a having gate comprising an input terminal.

* * * * *